United States Patent
Brush et al.

(10) Patent No.: US 6,373,098 B1
(45) Date of Patent: Apr. 16, 2002

(54) TRENCH-GATED DEVICE HAVING TRENCH WALLS FORMED BY SELECTIVE EPITAXIAL GROWTH AND PROCESS FOR FORMING DEVICE

(75) Inventors: Linda S. Brush; Jun Zeng, both of Mountaintop; Christopher B. Kocon, Plains, all of PA (US)

(73) Assignee: Fairchild Semiconductor Corporation, South Portland, MA (US)

( * ) Notice: Subject to any disclaimer, the term of this patent is extended or adjusted under 35 U.S.C. 154(b) by 0 days.

(21) Appl. No.: 09/318,334

(22) Filed: May 25, 1999

(51) Int. Cl.[7] .................. H01L 29/76; H01L 29/94; H01L 31/062; H01L 31/113; H01L 31/119
(52) U.S. Cl. .................. 257/330; 257/328; 257/332
(58) Field of Search .................. 257/329, 330, 257/331, 341, 328, 339, 401, 396, 622; 428/270, 271, 212, 257, 589, 588, 587; 438/269, 273

(56) References Cited

U.S. PATENT DOCUMENTS

| | | | |
|---|---|---|---|
| 5,378,655 A | * 1/1995 | Hutchings et al. | 438/138 |
| 5,489,787 A | * 2/1996 | Amaratunga et al. | 257/137 |
| 5,656,843 A | * 8/1997 | Goodyear et al. | 257/329 |
| 5,844,273 A | * 12/1998 | Konishi | 257/331 |
| 5,864,159 A | * 1/1999 | Takahashi | 257/330 |
| 5,895,951 A | * 4/1999 | So et al. | 257/330 |
| 5,929,482 A | * 7/1999 | Kawakami et al. | 257/328 |
| 5,973,367 A | * 10/1999 | Williams | 257/365 |
| 6,091,107 A | * 7/2000 | Amaratunga et al. | 257/331 |

FOREIGN PATENT DOCUMENTS

JP 406021468 * 1/1994 ......... H01L/29/784

* cited by examiner

Primary Examiner—Steven Loke
Assistant Examiner—Shouxiang Hu
(74) Attorney, Agent, or Firm—Jaeckle Fleischmann & Mugel, LLP

(57) ABSTRACT

An improved trench-gated power device comprises a substrate having an overlying layer of epitaxial material disposed on an upper layer of the substrate, well regions containing source and body regions, a trench gate, and a drain region. The improvement comprises a gate trench having beneficially smooth sidewalls that comprise selectively grown epitaxial material and body regions that are recessed with respect to adjacent source regions. In a process for forming an improved trench-gated power device, a dielectric layer having an upper surface and thickness and width dimensions that substantially correspond to the height and width dimensions of a gate trench is formed on an upper layer of the substrate. A layer of epitaxial material is grown on the upper layer of the substrate and the dielectric layer and planarized to be substantially coplanar with the upper surface of the dielectric layer, which is then removed, thereby forming gate trench sidewalls that comprise selectively grown epitaxial material. The process further comprises lining the trench with a dielectric material and substantially filling the lined trench with a conductive material, thereby forming a trench gate, and forming well, body, and source regions in the planarized epitaxial material.

17 Claims, 2 Drawing Sheets

TRENCH-GATED DEVICE HAVING TRENCH WALLS FORMED BY SELECTIVE EPITAXIAL GROWTH AND PROCESS FOR FORMING DEVICE

FIELD OF THE INVENTION

The present invention relates to semiconductor devices and, more particularly, to a trench-gated device having trench walls formed by selective epitaxial growth and a process for making the device.

BACKGROUND OF THE INVENTION

An MOS transistor having a trench gate structure offers important advantages over a planar transistor for high current, low voltage switching applications. The DMOS trench gate typically includes a trench extending from the source to the drain and having sidewalls and a floor that are each lined with a layer of thermally grown silicon dioxide. The lined trench is filled with doped polysilicon. The structure of the trench gate allows less constricted current flow and, consequently, provides lower values of specific on-resistance. Furthermore, the trench gate makes possible a decreased cell pitch in an MOS channel extending along the vertical sidewalls of the trench from the bottom of the source across the body of the transistor to the drain below. Channel density is thereby increased, which reduces the contribution of the channel to on-resistance. The structure and performance of trench DMOS transistors are discussed in Bulucea and Rossen, "Trench DMOS Transistor Technology for High-Current (100 A Range) Switching," in Solid-State Electronics, 1991, Vol. 34, No. 5, pp 493–507, the disclosure of which is incorporated herein by reference.

In addition to their utility in DMOS power devices, trench gates are also advantageously employed in insulated gate bipolar transistors (IGBTs), MOS-controlled thyristors (MCTs), and other trench-gated devices. A typical semiconductor device contains an array of MOSFET structures arranged in various cellular or stripe layouts currently used by the industry.

The trench gate of a MOSFET is typically formed by plasma etching a trench into a substrate and lining the trench with a dielectric material prior to substantially filling it with a conductive material. As required device dimensions become smaller, the surface roughness of the etched trench sidewall becomes increasingly important because of its effect on the threshold voltage and reliability of the device. The improved smoothness of the sidewalls in a device of the present invention provides an improvement in the efficiency and power handling capability of the device.

SUMMARY OF THE INVENTION

The present invention is directed to an improved trench-gated power device comprising a substrate having an overlying layer of epitaxial material disposed on an upper layer of the substrate, well regions containing source and body regions, a trench gate, and a drain region, wherein the improvement comprises a gate trench having beneficially smooth sidewalls that comprise selectively grown epitaxial material and body regions that are recessed with respect to adjacent source regions.

Further in accordance with the present invention is a process for forming an improved trench-gated power device. A dielectric layer having an upper surface and thickness and width dimensions that substantially correspond to the height and width dimensions of a gate trench is formed on an upper layer of a substrate. A layer of epitaxial material is grown on the upper layer of the substrate and the dielectric layer and planarized to be substantially coplanar with the upper surface of the dielectric layer, which is then removed, thereby forming gate trench sidewalls that comprise selectively grown epitaxial material. The process further comprises lining the trench with a dielectric material and substantially filling the lined trench with a conductive material, thereby forming a trench gate, and forming well, body, and source regions in the planarized epitaxial material.

DETAILED DESCRIPTION OF THE INVENTION

Figure 1:
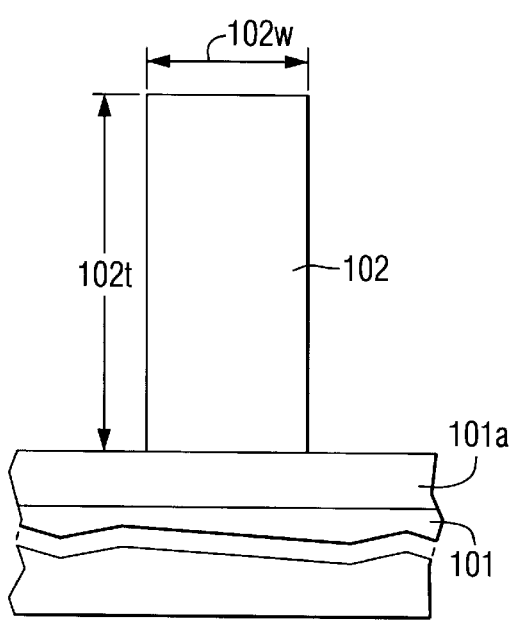
FIGS. 1–6 depict a process for forming a semiconductor device of the present...... invention.
Figure 2:
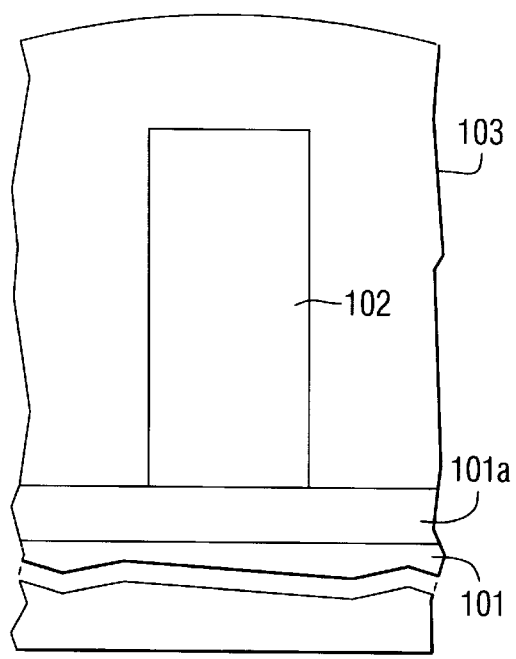

FIGS. 1–6 schematically illustrate a process for forming a trench-gated device 100 of the present invention on a semiconductor substrate 101, which can be N-doped monocrystalline silicon. Substrate 101 includes an upper layer 101a, which can be part of substrate 101 itself or; preferably, an epitaxial layer, of either N-type or P-type, that is thick enough to support breakdown voltage. A layer of dielectric material is grown or deposited on substrate upper layer 101a and masked and etched to form a dielectric layer 102, which has thickness and width dimensions 102t and 102w, respectively, as shown in FIG. 1. Typically, a plurality of dielectric layers 102 are formed on the surface of substrate 101. A layer 103 of epitaxial material, shown as P-type, is grown on layers 101a and 102, as depicted in FIG. 2. It is, of course, recognized that the dimensions of substrate 101, dielectric layer 102, epitaxial layer 103, and other features as shown in the figures are not to scale but are distorted for increased clarity.

Figure 3:
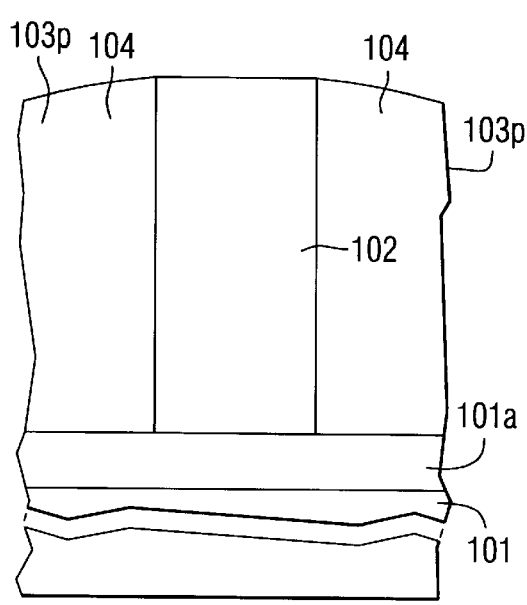
Figure 4:
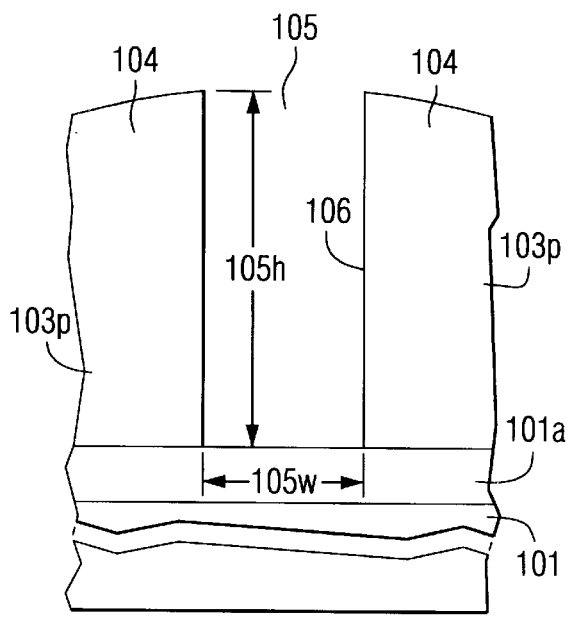

Layer 103 is planarized to layer 103p, as shown in FIG. 3. The thickness of layer 103p adjacent to dielectric layer 102 is substantially equal to 102t but becomes thinner in region 104 away from dielectric layer 102. Removal of layer 102 by a chemical etching procedure results in the formation of a gate trench 105 having sidewalls 106, as depicted in FIG. 4. Chemical etching of layer 102 may be carried out using, for example, an acidic agent such as hydrofluoric acid in a buffered oxide etch (BOE) process. Trench 105 has height and width dimensions 105h and 105w, respectively, that substantially correspond to the dimensions 102t and 102w of dielectric layer 102.

Figure 5:
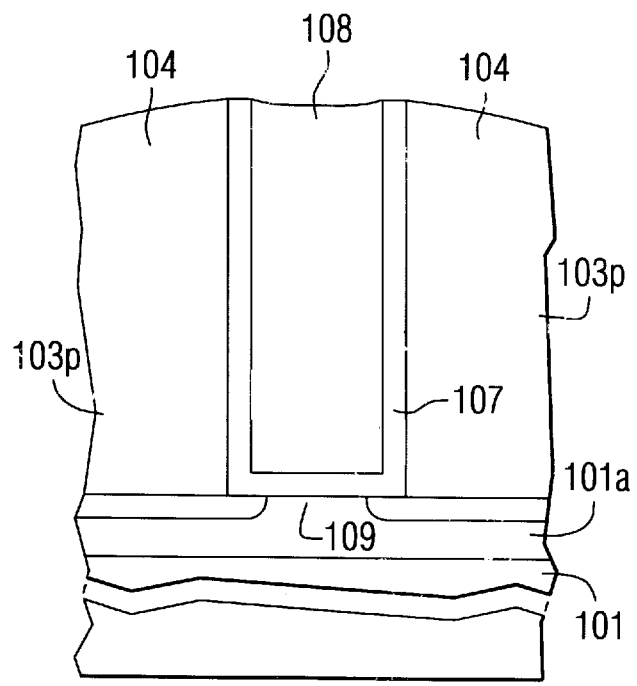

Gate trench 105 is lined with dielectric material 107, which can be silicon dioxide, and substantially filled with a conductive material 108 such as doped polysilicon to form a trench gate 109, as shown in FIG. 5. A surface cleaning step can optionally be employed prior to lining trench 105 with dielectric material 107; the trench lining process causes epitaxial layer 103p to diffuse laterally and vertically around the corner of trench 105, thereby mitigating possible trench corner-related reliability problems.

Figure 6:
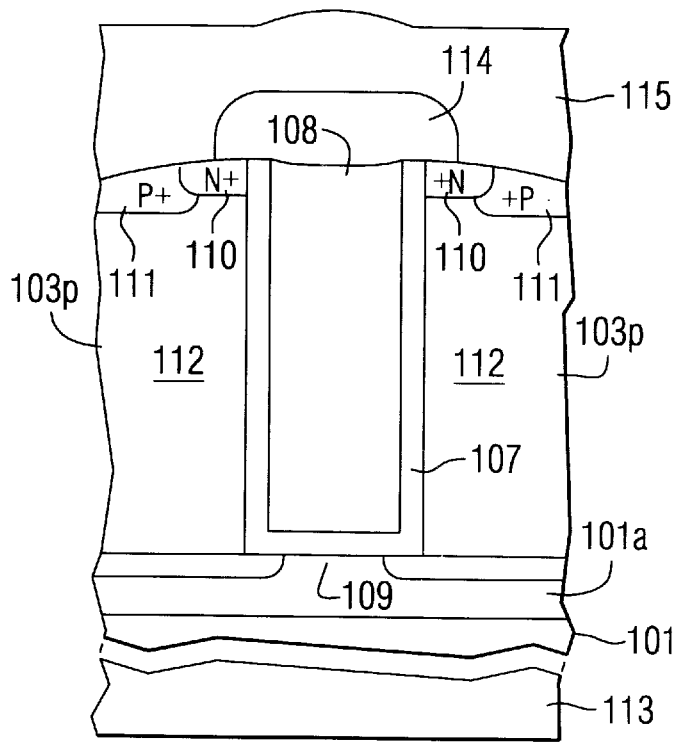

As depicted in FIG. 6, the fabrication of device 100 is completed by implantation and thermal activation/diffusion to form N+ source regions 110 and P+ body regions 111. The lower portion of epitaxial layer 103p serves as a P-well region 112, and the lower portion of substrate 101 provides a drain region 113. An interlevel dielectric layer 114 is formed over source regions 110 and gate trench 109, and metal layer 115, which is in electrical contact with source and body regions 110 and 111, respectively, is deposited over epitaxial layer 103p and interlevel dielectric layer 114.

A metal layer (not shown) is also deposited on the lower surface of substrate 101 to provide a contact with drain region 113.

Because of their method of formation, gate trench sidewalls 106 are beneficially smoother than they would have been had gate trench 105 been formed by plasma etching. Also as noted above, because the epitaxial layer planarization procedure produces a thinner region 104 of planarized layer 103p, body regions 111 of device 100 are recessed, which provides a potential advantage of increased contact area and improved unclamped inductive switching (UIS) capability.

Variations of the described specific process flow are contemplated as being with the present invention. For example, the sequence of source and body region formation in relation to interlevel dielectric formation can be altered without affecting the final device function and layout. Also as described, a well region is defined within the selectively grown P-type epitaxial layer, the uniformly doped well providing a good balance between on-resistance and short channel effects. However the well can also be formed by selectively growing an N-type epitaxial layer, which is then doped by ion implantation and diffusion of a P-type dopant. As described above, the present invention is illustrated using an N-channel silicon substrate, but it can also be applied to other devices and other dopants and other semiconductor materials, for example, silicon-germanium. The described device is a power MOSFET, but the invention is applicable to all trench-gated devices, for example, insulated gate bipolar transistors (IGBTs), MOS-controlled thyristors (MCTs), and the like.

The invention has been described in detail for the purpose of illustration, but it is understood that such detail is solely for that purpose, and variations can be made therein by those skilled in the art without departing from the spirit and scope of the invention, which is defined by the following claims.

What is claimed:

1. An improved trench-gated power device comprising a substrate having a layer of epitaxial material comprising uniformly doped well regions overlying an upper layer of said substrate, heavily doped source regions and heavily doped body regions contiguous to one another and disposed in an upper portion of said uniformly doped well regions, a gate trench, and a drain region, said gate trench having a floor and sidewalls that are substantially parallel to one another, said sidewalls comprising epitaxial material and being entirely disposed within said uniformly doped well regions, said well regions extending laterally beneath said trench floor, wherein the improvement comprises: said heavily doped body regions having upper contact surfaces that are recessed with respect to upper contact surfaces of said contiguous heavily doped source regions.

2. The device of claim 1 wherein said substrate is of a first conduction type and said layer of epitaxial material on said upper layer is of a second opposite conduction type.

3. The device of claim 2 wherein said first conduction type is N and said second conduction type is P.

4. The device of claim 1 wherein said substrate and said epitaxially grown material on said upper layer are both of a first conduction type.

5. The device of claim 1 wherein said upper layer of said substrate is included within said substrate.

6. The device of claim 1 wherein said upper layer of said substrate comprises epitaxial material.

7. The device of claim 1 wherein said well, source, and body regions are included in said layer of epitaxial material.

8. The device of claim 7 wherein said well regions and said layer of epitaxial material are of opposite conduction types.

9. The device of claim 1 wherein said substrate and said layer of epitaxial material comprise silicon.

10. The device of claim 1 wherein said drain region is disposed in a lower portion of said substrate.

11. The device of claim 1 further comprising an interlevel dielectric layer overlying said gate trench and said source regions, and a metal layer overlying said interlevel dielectric layer, said metal layer being in electrical contact with said source and body regions, said upper contact surfaces of said source and body regions being continuous with each other.

12. The device of claim 1 wherein said device comprises a plurality of gate trenches.

13. The device of claim 12 wherein said plurality of gate trenches have an open-cell stripe topology.

14. The device of claim 12 wherein said plurality of gate trenches has a closed-cell cellular topology.

15. The device of claim 1 wherein said device is selected from the group consisting of a power MOSFET, an insulated gate bipolar transistor, and an MOS-controlled thyristor.

16. The device of claim 1 wherein said sidewalls are formed by removing from said layer of epitaxial material an included layer of dielectric material having thickness and width dimensions substantially corresponding to height and width dimensions of said gate trench.

17. The device of claim 16 wherein said layer of dielectric material is removed from said layer of epitaxial material using a buffered oxide etch (BOE) process.

* * * * *